US007652603B2

(12) United States Patent
Morishima

(10) Patent No.: US 7,652,603 B2
(45) Date of Patent: Jan. 26, 2010

(54) ΔΣ-TYPE AD CONVERTER, CLASS-D AMPLIFIER, AND DC-DC CONVERTER

(75) Inventor: Morito Morishima, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/072,863

(22) Filed: Feb. 28, 2008

(65) Prior Publication Data

US 2008/0211578 A1 Sep. 4, 2008

(30) Foreign Application Priority Data

Mar. 2, 2007 (JP) ............................ 2007-052299

(51) Int. Cl.
*H03M 1/00* (2006.01)

(52) U.S. Cl. ........................ 341/142; 341/143; 341/155

(58) Field of Classification Search ................. 341/155, 341/143, 157, 142; 375/238, 247; 330/250, 330/251
See application file for complete search history.

(56) References Cited

U.S. PATENT DOCUMENTS

| | | | | |
|---|---|---|---|---|
| 4,990,912 | A * | 2/1991 | Selwa | 341/132 |
| 5,416,481 | A * | 5/1995 | Chen | 341/131 |
| 5,883,590 | A * | 3/1999 | Sugden et al. | 341/164 |
| 5,949,360 | A | 9/1999 | Maejima | |
| 6,426,663 | B1 * | 7/2002 | Manlove et al. | 327/307 |
| 6,448,827 | B1 * | 9/2002 | Tojima | 327/172 |
| 6,542,105 | B2 * | 4/2003 | Sakuragi | 341/164 |
| 6,600,295 | B2 * | 7/2003 | Kanekawa et al. | 323/222 |
| 7,183,957 | B1 * | 2/2007 | Melanson | 341/143 |
| 7,495,964 | B2 * | 2/2009 | Taylor et al. | 365/185.21 |
| 2006/0244508 | A1 * | 11/2006 | Zheng et al. | 327/384 |
| 2008/0095213 | A1 * | 4/2008 | Lin et al. | 374/170 |

FOREIGN PATENT DOCUMENTS

| | | |
|---|---|---|
| JP | 9074356 | 3/1997 |
| JP | 2000174627 | 6/2000 |
| WO | WO 2005/082236 A2 | 9/2005 |

OTHER PUBLICATIONS

Koreal Intellectual Property Office: Notice Requesting Submission of Opinion, (dated Aug. 31, 2009, 4 pgs.).

* cited by examiner

*Primary Examiner*—Peguy JeanPierre
(74) *Attorney, Agent, or Firm*—Pillsbury Winthrop Shaw Pittman LLP

(57) ABSTRACT

A ΔΣ-type AD converter includes a subtractor which receives an analogue input signal and a feedback signal and which outputs a signal pertaining to a difference between the signals, an integrator which integrates a signal output from the subtractor, a comparator which binarizes a signal output from the integrator by comparing with a predetermined threshold value, a counter which measures respective pulse widths of a signal output from the comparator, and a PWM circuit which outputs a pulse signal of a predetermined period having a duty cycle responsive to a count value output from the counter and which feeds back the pulse signal as the feedback signal to the subtractor. The counter measures the respective pulse widths in each PWM frame period in synchronism with the PWM circuit, and the PWM circuit feeds back to the subtractor a pulse signal whose duty cycle is set in accordance with a value of the measured pulse width in a next PWM frame. A count value output from the counter is extracted as a converted digital output value.

10 Claims, 7 Drawing Sheets

ΔΣ-TYPE AD CONVERTER, CLASS-D AMPLIFIER, AND DC-DC CONVERTER

BACKGROUND

The present invention relates to a ΔΣ-type AD converter arranged so as to exhibit a high dynamic range while a ΔΣ-modulated sampling frequency is suppressed to a comparatively-low level. The present invention also provides a class-D amplifier and a DC-DC converter which utilize the ΔΣ-type AD converter.

FIG. 2 shows a related-art ΔΣ-type AD converter. A subtractor 10 subjects an analogue input signal and a feedback signal to subtraction. An integrator 14 integrates a signal output from the subtractor 10. A quantizer 16 compares a signal output from the integrator 14 with a predetermined threshold value, thereby binarizing the signal. A signal output from the quantizer 16 is a one-bit digital signal which assumes a value of "1" or "0" at a sampling interval unit of ΔΣ modulation, and the one-bit digital signal is subjected to analogue-to-digital conversion, and a result of conversion is output. The one-bit digital signal is subjected to one sample delay by means of a one sample delay circuit 12, and the thus-delayed signal is fed back as the feedback signal to the subtractor 10. ΔΣ-type AD converters, such as those described in; for example, Patent Documents 1 and 2, are available as a related-art ΔΣ-type AD converter.

[Patent Document 1] JP-A-2000-174627

[Patent Document 2] JP-B-2856117

A dynamic range of the ΔΣ-type AD converter changes according to a sampling frequency, and a required dynamic range has hitherto been ensured by means of increasing the sampling frequency. However, as a result of an increase in the sampling frequency, an operational amplifier capable of making a high-speed response over a wide range is required as an operational amplifier used in an integrator, which adds to cost.

SUMMARY

The present invention aims at solving the above-mentioned problem and provides a ΔΣ-type AD converter which exhibits a high dynamic range while the sampling frequency of ΔΣ modulation is suppressed to a comparatively-low level. The present invention also provides a class-D amplifier and DC-DC converter which utilize the configuration of the ΔΣ-type AD converter.

A ΔΣ-type AD converter of the present invention includes a subtractor which receives an analogue input signal and a feedback signal and which outputs a signal pertaining to a difference between the analogue input signal and the feedback signal; an integrator which integrates a signal output from the subtractor; a comparator which binarizes a signal output from the integrator by comparing with a predetermined threshold value; a counter which measures respective pulse widths of a signal output from the comparator; and a PWM circuit which outputs a pulse signal of predetermined period having a duty cycle responsive to a count value output from the counter and which feeds back the pulse signal as the feedback signal to the subtractor, wherein the counter measures the respective pulse widths in each PWM frame period in synchronism with the PWM circuit, and the PWM circuit feeds back to the subtractor a pulse signal whose duty cycle is set in accordance with a value of the measured pulse width in a next PWM frame; and a count value output from the counter is extracted as a converted digital output value.

The signal output from the quantizer 16 of the related-art circuit shown in FIG. 2 corresponds to a signal (a one-bit digital signal) which comes to "1" or "0" in a sampling period of ΔΣ modulation, as mentioned previously. Consequently, the signal fed back to the subtractor 10 by way of the one-sample delay circuit 12 also comes to "1" or "0" in the sampling period of ΔΣ modulation. Therefore, the dynamic range of an output AD-converted by the related-art circuit is univocally determined by the sampling frequency. In order to increase a dynamic range, the sampling frequency must be increased. In contrast, according to the ΔΣ-type AD converter of the present invention, the signal output from the comparator can assume various pulse widths in the sampling period of ΔΣ modulation in accordance with the level of an output from the integrator. Consequently, an output count value of the counter responsive to the pulse width of the signal output from the comparator can also assume various values in the sampling period of ΔΣ modulation. Further, an output signal of the PWM circuit responsive to the output count value of the counter can also assume various duty cycles in the sampling period of ΔΣ modulation. Consequently, resolving power determined from the duty cycle of the signal output from the PWM circuit contributes to a dynamic range of an AD-converted output, so that the dynamic range can be enhanced. Therefore, a high dynamic range can be acquired while the sampling frequency of ΔΣ modulation is suppressed to a comparatively-low level.

A class-D amplifier of the present invention utilizes the configuration of the ΔΣ-type AD converter of the present invention. The class-D amplifier includes a first subtractor which receives digital audio input data and digital feedback data and which outputs data pertaining to a difference between the digital audio input data and the digital feedback data; a first PWM circuit which outputs a pulse signal having a duty cycle responsive to data output from the first subtractor; a switching circuit (a switching circuit in a class-D output stage) which is switched on the basis of a signal output from the first PWM circuit; a low-pass filter which smoothes a signal output from the switching circuit and which supplies the smoothed signal to a speaker (an ear speaker, a loud speaker, or the like); and an AD converter which subjects a signal output from the low-pass filter to AD conversion and which feeds back the converted digital signal to the first subtractor as the digital feedback data, wherein the AD converter includes a second subtractor which receives the signal output from the low-pass filter and a feedback signal and which outputs a signal pertaining to a difference between the signal output from the low-pass filter and the feedback signal, an integrator which integrates the signal output from the second subtractor, a comparator which binarizes a signal output from the integrator by comparing with a predetermined threshold value, a counter which measures respective pulse widths of a signal output from the comparator, and a second PWM circuit which outputs a pulse signal of a predetermined period having a duty cycle responsive to a count value output from the counter and which feeds back the pulse signal as the feedback signal to the second subtractor; and wherein a count value output from the counter is fed back as the digital feedback data to the first subtractor by way of or by bypassing a decimation filter. According to the class-D amplifier, the AD converter exhibits a high dynamic range by means of resolving power of the second PWM circuit, and hence distortion in an output from the class-D amplifier can be reduced with superior efficiency. The PWM frame of the first PWM circuit and the PWM frame of the second PWM circuit can be synchronized to each other.

A class-D amplifier of the present invention includes a first subtractor which receives digital audio input data and digital feedback data and which outputs data pertaining to a difference between the digital audio input data and the digital feedback data; a first PWM circuit which outputs a pulse signal having a duty cycle responsive to data output from the first subtractor; a switching circuit which is switched on the basis of a signal output from the first PWM circuit; a low-pass filter which smoothes a signal output from the switching circuit and which supplies the smoothed signal to a speaker; and an AD converter which subjects a signal output from the low-pass filter to AD conversion and which feeds back the converted digital signal to the first subtractor as the digital feedback data, wherein the AD converter includes a second subtractor which receives the signal output from the low-pass filter and a feedback signal and which outputs a signal pertaining to a difference between the signal output from the low-pass filter and the feedback signal, a comparator which binarizes the signal output from the second subtractor by comparing with a predetermined threshold value, a counter which measures respective pulse widths of a signal output from the comparator, a second PWM circuit which outputs a pulse signal of a predetermined period having a duty cycle responsive to a count value output from the counter, an integrator which integrates the pulse signal output from the second PWM circuit and which feeds back an integrated signal as the feedback signal to the second subtractor; and wherein a count value output from the counter is fed back as the digital feedback data to the first subtractor by bypassing a decimation filter; and the pulse signal output from the first PWM circuit and the pulse signal output from the second PWM circuit are synchronized to each other, and an integration constant of the low-pass filter and an integration constant of the integrator are set so as to become equal to each other. In this case, when the circuit does not operate well as a result of an output from the low-pass filter and an output from the integrator becoming an identical signal in a steady state, the second PWM circuit outputs a pulse signal of a predetermined period having a duty cycle responsive to a value resultant from multiplication of the count value of the counter by a factor of −1; and the integrator integrates the pulse signal output from the second PWM circuit and feeds back, as the feedback signal, to the second subtractor a signal resultant from inversion of a polarity of the integrated signal, thereby solving the problem.

A DC-DC converter of the present invention utilizes the configuration of the ΔΣ-type AD converter of the present invention. The DC-DC converter includes a first subtractor which receives digital target value data and digital feedback data and which outputs data pertaining to a difference between the digital target value data and the digital feedback data; a first PWM circuit which outputs a pulse signal having a duty cycle responsive to data output from the first subtractor; a switching circuit which is switched on the basis of the pulse signal output from the first PWM circuit; a low-pass filter which smoothes a signal output from the switching circuit and which supplies the smoothed signal to a load; and an AD converter which subjects a signal output from the low-pass filter to AD conversion and which feeds back the converted digital signal to the first subtractor as the digital feedback data, wherein the AD converter includes a second subtractor which receives the signal output from the low-pass filter and a feedback signal and which outputs a signal pertaining to a difference between the signal output from the low-pass filter and the feedback signal, an integrator which integrates the signal output from the second subtractor, a comparator which binarizes a signal output from the integrator by comparing with a predetermined threshold value, a counter which measures respective pulse widths of a signal output from the comparator, and a second PWM circuit which outputs a pulse signal of a predetermined period having a duty cycle responsive to a count value output from the counter and which feeds back the pulse signal as the feedback signal to the second subtractor; and wherein a count value output from the counter is fed back as the digital feedback data to the first subtractor by way of or by bypassing a decimation filter. According to the DC-DC converter, the AD converter exhibits a high dynamic range by means of resolving power of the second PWM circuit, and hence a DC-DC converted output can be controlled with high accuracy. The PWM frame of the first PWM circuit and the PWM frame of the second PWM circuit can also be synchronized to each other.

A DC-DC converter of the present invention includes a first subtractor which receives digital target value data and digital feedback data and which outputs data pertaining to a difference between the digital target value data and the digital feedback data; a first PWM circuit which outputs a pulse signal having a duty cycle responsive to the data output from the first subtractor; a switching circuit which is switched on the basis of the pulse signal output from the first PWM circuit; a low-pass filter which smoothes a signal output from the switching circuit and which supplies the smoothed signal to a load; and an AD converter which subjects a signal output from the low-pass filter to AD conversion and which feeds back the converted digital signal to the first subtractor as the digital feedback data, wherein the AD converter includes a second subtractor which receives the signal output from the low-pass filter and a feedback signal and which outputs a signal pertaining to a difference between the signal output from the low-pass filter and the feedback signal, a comparator which binarizes a signal output from the second subtractor by comparing with a predetermined threshold value, a counter which measures respective pulse widths of a signal output from the comparator, a second PWM circuit which outputs a pulse signal of a predetermined period having a duty cycle responsive to a count value output from the counter, an integrator which integrates the pulse signal output from the second PWM circuit and which feeds back an integrated signal as the feedback signal to the second subtractor; and wherein a count value output from the counter is fed back as the digital feedback data to the first subtractor by bypassing a decimation filter; and the pulse signal output from the first PWM circuit and the pulse signal output from the second PWM circuit are synchronized to each other, and an integration constant of the low-pass filter and an integration constant of the integrator are set so as to become equal to each other. In this case, when the circuit does not operate well as a result of an output from the low-pass filter and an output from the integrator becoming an identical signal in a steady state, the second PWM circuit outputs, as in the case of the class-D amplifier, the pulse signal of a predetermined period having a duty cycle responsive to a value resultant from multiplication of the count value of the counter by a factor of −1; and the integrator integrates the pulse signal output from the second PWM circuit and feeds back, as the feedback signal, to the second subtractor a signal resultant from inversion of a polarity of the integrated signal, thereby solving the problem.

Another DC-DC converter of the present invention includes a step-down chopper circuit or a step-up chopper circuit provided in a loop of the ΔΣ-type AD converter of the present invention. The DC-DC converter includes a subtractor which receives, as inputs, an analogue target value signal and a feedback signal and which outputs a signal pertaining to a difference between the inputs; a comparator for binarizing a signal output from the subtractor by means of a predetermined threshold value; a counter for measuring respective pulse widths of a signal output from the comparator; a PWM circuit for outputting a pulse signal of a predetermined period having a duty cycle responsive to a count value output from the counter; and a step-down chopper circuit or a step-up chopper circuit formed by combination of a switching element switched by means of a signal output from the PWM circuit, an inductor, a capacitor, and a diode, wherein a voltage output from the step-down chopper circuit or the step-up chopper circuit is fed back as the feedback signal to the subtractor, and a voltage output from the step-down chopper circuit or the step-up chopper circuit is supplied to a load. According to the DC-DC converter, the AD converter exhibits a high dynamic range by means of resolving power of the PWM circuit, and hence a DC-DC converted output can be controlled with high accuracy.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

First Embodiment

Embodiment for Implementing a ΔΣ-Type AD Converter

Figure 1:
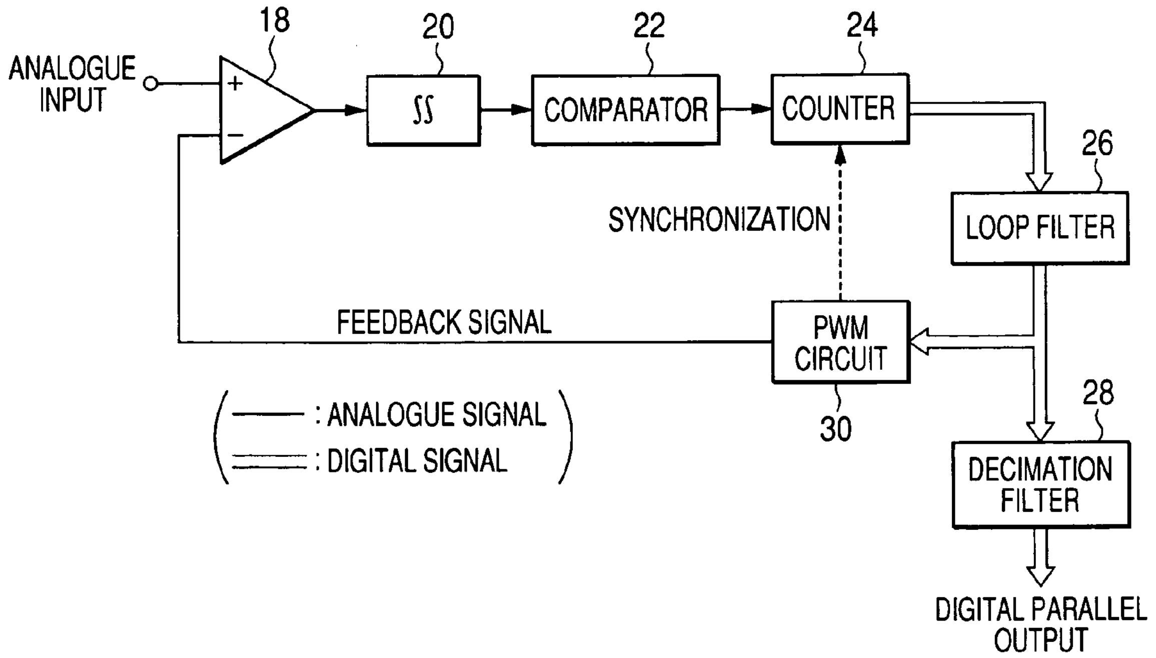
FIG. 1 is a block diagram showing a ΔΣ-type AD converter according to an embodiment of the present invention.
Figure 2:
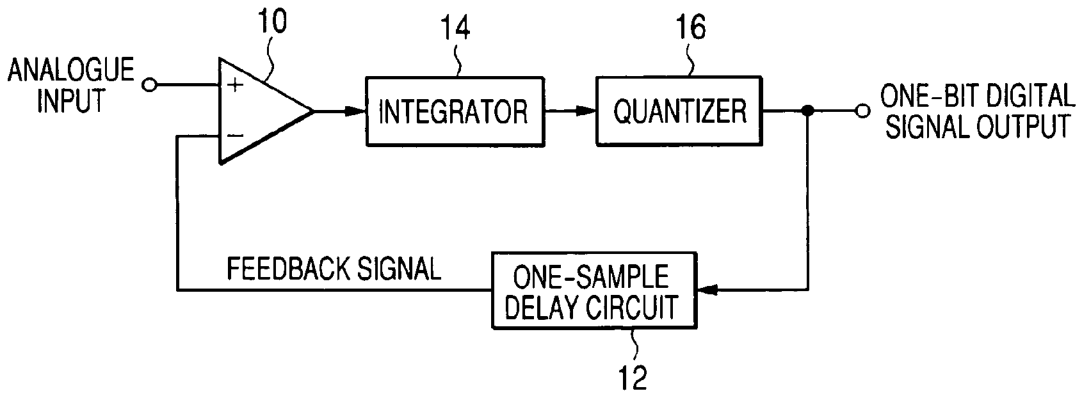
FIG. 2 is a block diagram showing a related-art ΔΣ-type AD converter.

FIG. 1 shows a ΔΣ-type AD converter according to an embodiment of the present invention. A subtractor 18 (a differential amplifier) subjects an analogue input signal and a feedback signal to subtraction, thereby outputting a signal pertaining to a difference between the signals. An integrator 20 is configured by use of an operational amplifier and subjects a signal output from the subtractor 18 to analogue integration. A comparator 22 binarizes a signal output from the integrator 20 by comparison with a predetermined threshold value. A counter 24 counts a clock signal of predetermined frequency, thereby measuring respective pulse widths of a signal output from the comparator 22. Data output from the counter 24 are decimated to a predetermined sampling rate by a decimation filter 28 by way of a loop filter 26 for phase compensation and gain adjustment purposes. Data output from the decimation filter 28 come to be an AD-converted output. A PWM circuit 30 outputs a pulse signal (a PWM signal) of a predetermined PWM frame period (=a sampling period of ΔΣ modulation) having a duty cycle responsive to a value of an output from the loop filter 26, and the PWM signal is input as a feedback signal to the subtractor 18 through feedback.

The period of the clock signal used for driving the counter 24 is sufficiently shorter than the sampling period of ΔΣ modulation. For example, when the sampling frequency of ΔΣ modulation is set to 200 kHz and the clock frequency of the counter 24 is set to 200 MHz, the pulse width of the signal output from the comparator 22 can be measured with resolving power that is determined by dividing the sampling period of ΔΣ modulation by 1000. As a result, the resolving power of the PWM signal also serves as resolving power determined by dividing the sampling period of ΔΣ modulation by 1000.

Figures 3A, 3B, 3C, 3D, 3E, 3F, 3G:
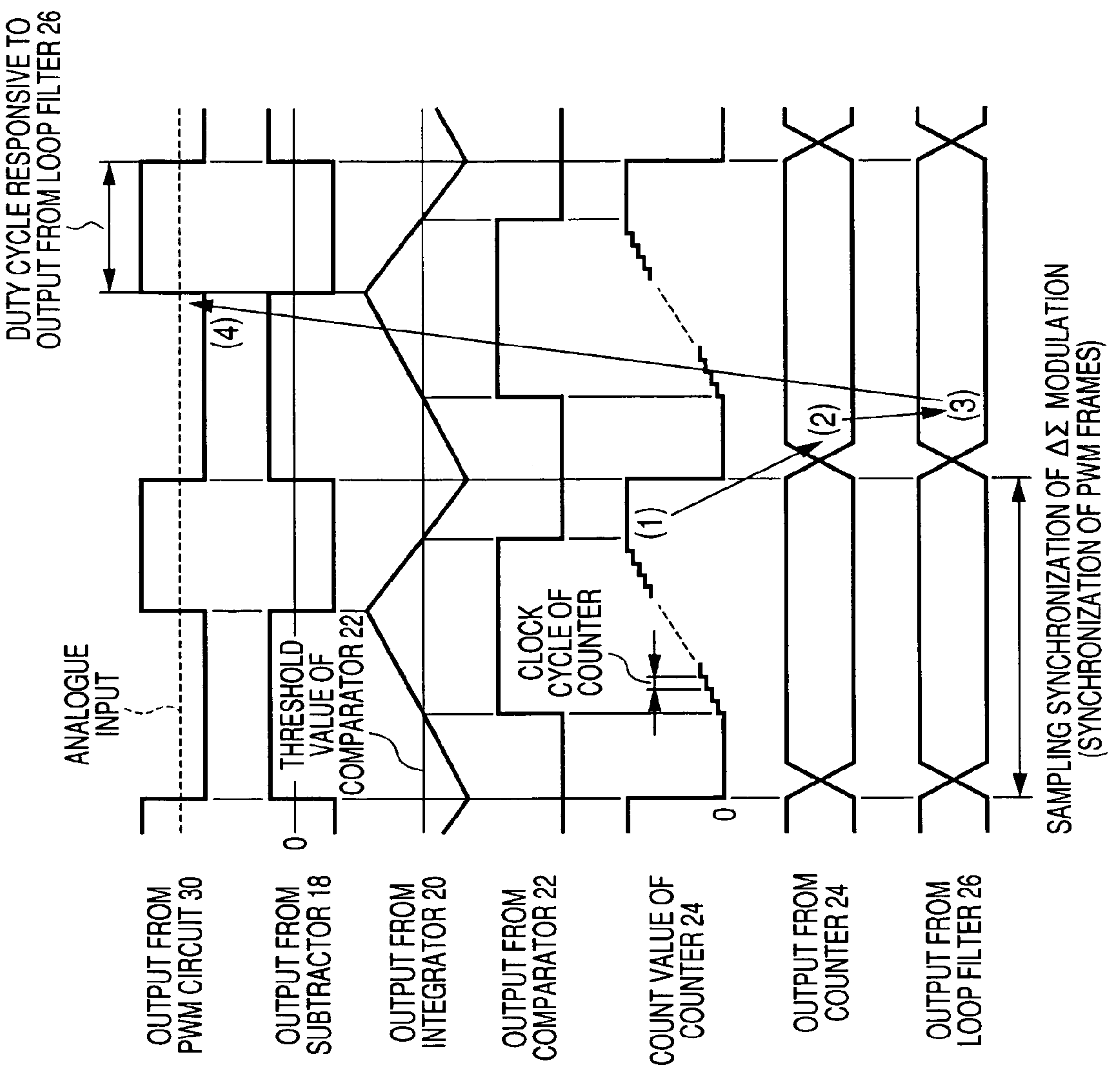
FIG. 3 is a chart showing operating waveforms of the ΔΣ-type AD converter shown in FIG. 1.

FIG. 3 shows an operation waveform of the ΔΣ-type AD converter shown in FIG. 1. FIG. 3A shows a waveform output from the PWM circuit 30 (in conjunction with an analogue input signal). The level of the analogue input varies within a range between a level "1" of the PWM signal and a level "0" of the same. The sampling period of ΔΣ modulation is defined by means of a period of the PWM signal (a PWM frame period). FIG. 3B shows a waveform output from the subtractor 18, and a signal pertaining to a difference between the PWM signal shown in FIG. 3A and the analogue input acts as a signal output from the subtractor 18. FIG. 3C shows a waveform output from the integrator 20 (along with a threshold value of the comparator 22), and the integral output ascends or descends in accordance with an output produced through subtraction shown in FIG. 3B. FIG. 3D shows a waveform output from the comparator 22 and which is a pulse signal assuming a value of "1" in a segment where the integral output shown in FIG. 3C is higher than the threshold value (e.g., 0V) of the comparator 22 and a value of "0" in a segment where the integral output is equal to or lower than the threshold value. FIG. 3E shows a change in a count value of the counter 24. The count value is sequentially incremented from zero, by means of the clock signal, every time the pulse output from the comparator 22 rises to "1." When the pulse falls to "0," counting is stopped. Consequently, a final count value achieved in each PWM frame period serves as a measured pulse width value of the pulse output from the comparator 22 during the PWM frame period. Thus, the counter 24 measures a pulse width of the pulse output from the comparator 22 for each PWM frame period (=the sampling period of ΔΣ modulation) in synchronism with the PWM circuit 30.

FIG. 3F shows an output from the counter 24, and a final value [indicated by (1) in FIG. 3E] of the counter 24 achieved in each sampling period of ΔΣ modulation is output in the next sampling period [indicated by (2) in FIG. 3F]. FIG. 3G shows an output from the loop filter 26, and which is a value [indicated by (3) in FIG. 3G] determined by causing the output [indicated by (2) in FIG. 3F] from the counter to pass through a low-pass filter. A duty cycle [indicated by (4) in FIG. 3A] of the PWM signal output from the PWM circuit 30 in the sampling period is set in accordance with the value of an output from the loop filter 26 [indicated by (3) in FIG. 3G]. Specifically, a duty cycle of the PWM signal for the next PWM frame is set in accordance with the width of the pulse output from the comparator 22 measured in a certain PWM frame, and the PWM signal is fed back to the subtractor 18 in the same PWM frame. For instance, the ΔΣ-type AD converter is set such that, when an analogue input is 0V, the PWM signal shown in FIG. 3A and the output from the comparator shown in FIG. 3D come to assume a duty cycle of 50%.

According to FIG. 3, when the analogue input shown in FIG. 3A is increased, the output of the subtractor shown in FIG. 3B shifts in a positive direction, and the output of the integrator shown in FIG. 3C shifts in a positive direction. Therefore, the pulse width of the output from the comparator shown in FIG. 3D spreads, and the final count value shown in FIG. 3E increases. The thus-increased final count value is reflected on the PWM signal shown in FIG. 3A in the next PWM frame period, and the duty cycle of the PWM signal increases. Consequently, a positive time duration of the output from the subtractor shown in FIG. 3B becomes narrow, and the output from the integrator shown in FIG. 3C is slightly moved back in the negative direction. Thus, a delay equivalent to one sample of ΔΣ modulation arises between the counter 24 and the PWM circuit 30, and negative feedback is effected so as to suppress variations in the output from the integrator shown in FIG. 3C. The final count value of the counter 24 is stabilized at a value responsive to the level of the analogue input. As a result, a digital output into which the analogue input is transformed through A/D conversion is acquired from the counter 24.

According to the above-mentioned operation, the PWM signal fed back to the subtractor 18 exhibits resolving power resulting from segmentation of the sampling period of ΔΣ modulation, and hence a dynamic range is enhanced correspondingly. For instance, provided that the counter 24 makes 256 counts in one sampling period of ΔΣ modulation and that the PWM signal exhibits resolving power (resolving power equivalent to eight bits) determined by dividing one sampling period of ΔΣ modulation by 256, the dynamic range is enhanced by 48 dB (eight bits×6 dB) by means of resolving power of the PWM signal. Consequently, when a dynamic range of 100 dB is required over the entire AD converter, acquisition of 52 dB becomes sufficient for a dynamic range stemming from ΔΣ modulation, so that the sampling frequency of the ΔΣ-type AD converter can be suppressed to a low level. Further, an advantage of jitter in the digital output being reduced by means of resolving power of the PWM signal is also yielded.

Figure 4:
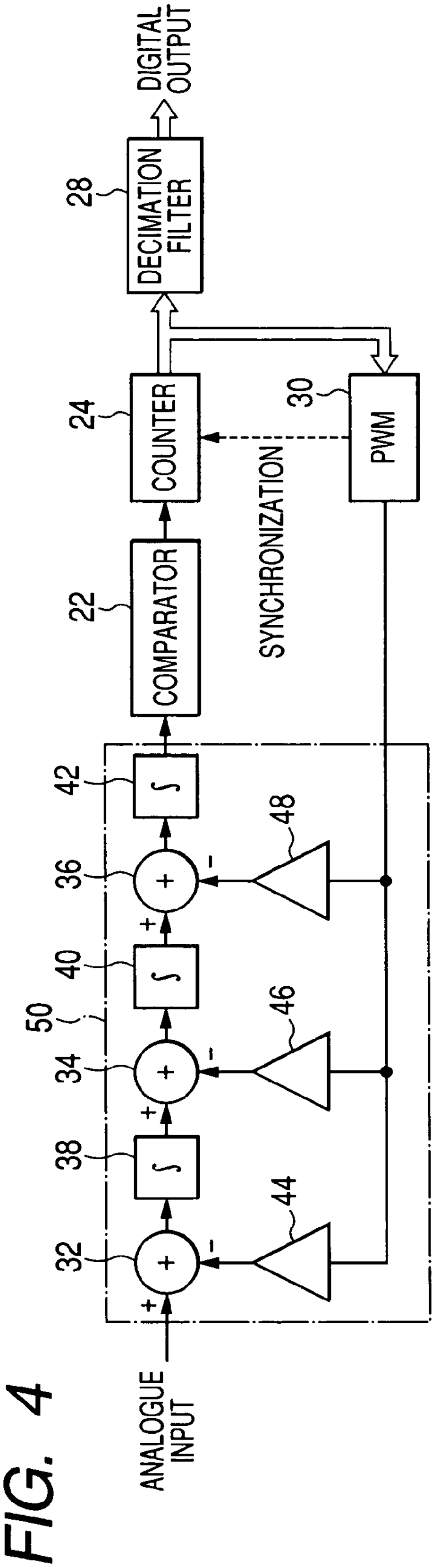
FIG. 4 is a block diagram showing a specific example of the AD converter shown in FIG. 1.

FIG. 4 shows a specific example of the AD converter shown in FIG. 1. The AD converter is configured as a three-dimensional ΔΣ modulation AD converter. A circuit 50 built from subtractors 32, 34, 36, integrators 38, 40, 42, and coefficient units 44, 46, and 48 corresponds to a combination of the subtractor 18, the integrator 20, and the loop filter 26 which are shown in FIG. 1. As in the case of FIG. 1, one sample delay is effected between the counter 24 and the PWM circuit 30. A characteristic of the loop filter 26 is adjusted by means of coefficient values of the coefficient units 44, 46, and 48.

Figure 5:
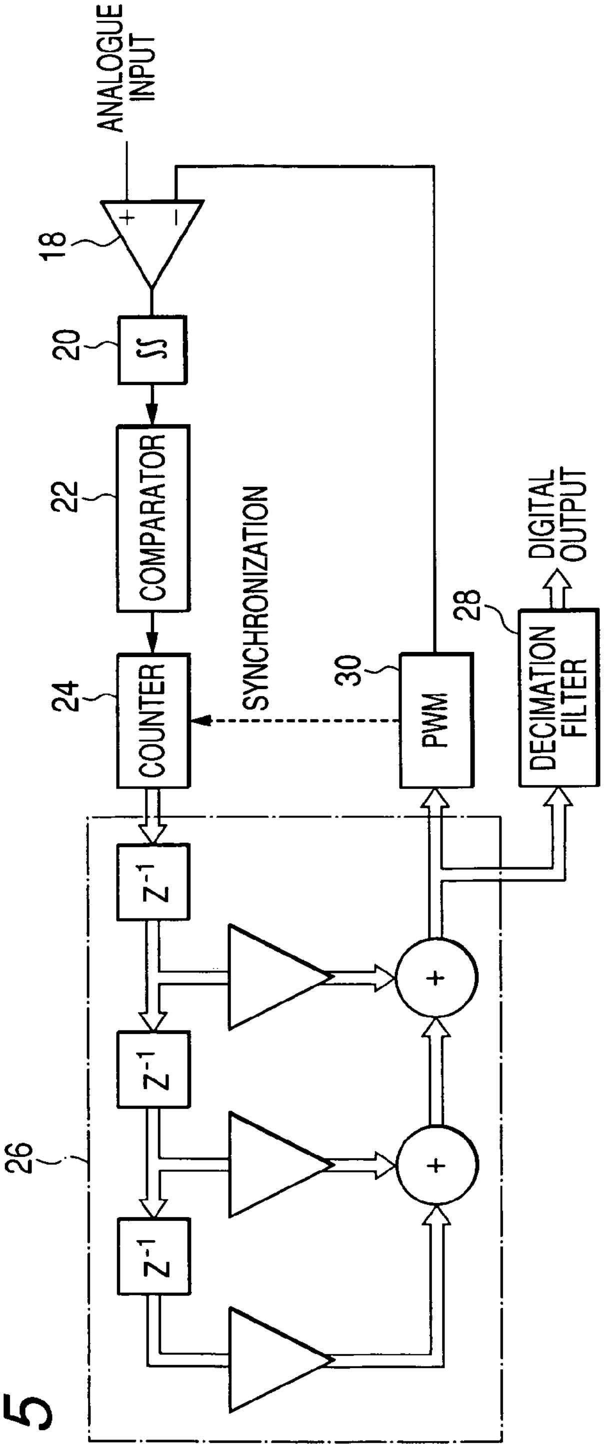
FIG. 5 is a block diagram showing another specific example of the AD converter shown in FIG. 1.

FIG. 5 shows another specific example of the AD converter shown in FIG. 1. The AD converter is formed from a three-dimensional FIR filter in which the loop filter 26 is formed from a DSP or the like. When an order is increased by the FIR filter, the loop filter 26 can also be formed from an IIR filter.

Second Embodiment

Embodiment for Implementing a Class-D Amplifier

Figure 6:
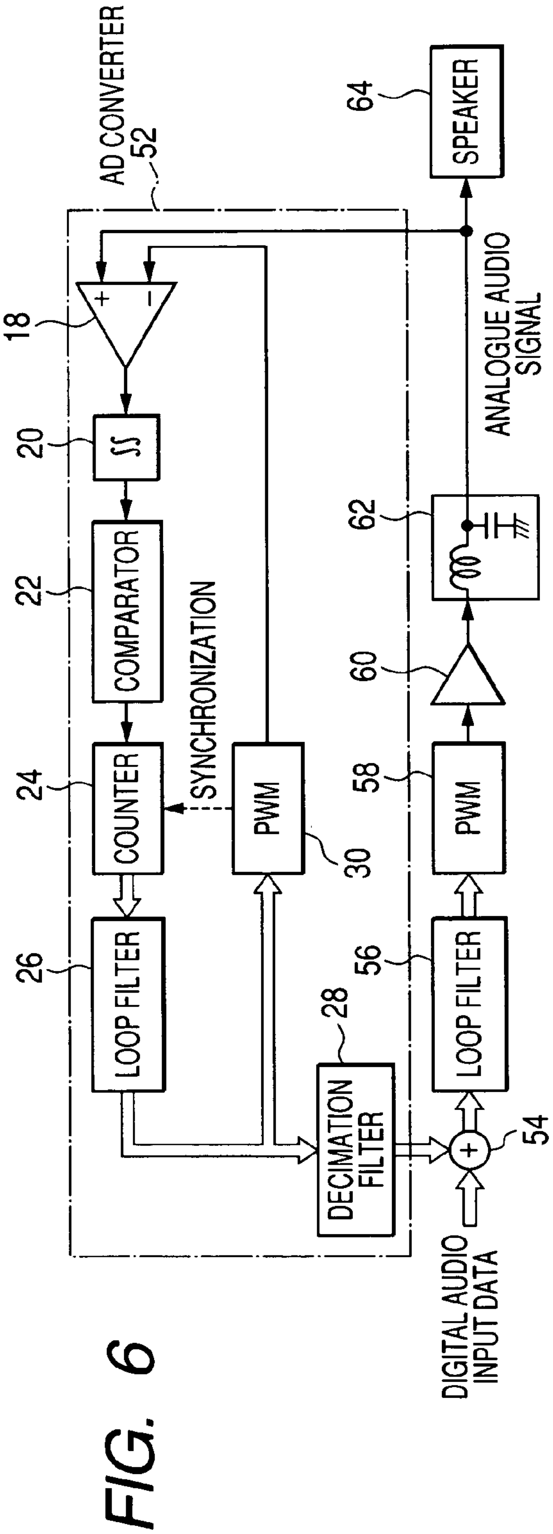
FIG. 6 is a block diagram showing a class-D amplifier according to an embodiment of the present invention.

FIG. 6 shows a class-D amplifier according to an embodiment of the present invention. A circuit 52 enclosed by a dashed line forms a ΔΣ-type AD converter of the present invention. In the AD converter 52, elements common to those shown in FIG. 1 are assigned the same reference numerals. A subtractor 54 subjects digital audio input data to subtraction along with digital feedback data output from the AD converter 52. Difference data output from the subtractor 54 are input to a PWM circuit 58 by way of a loop filter 56 for compensating for the phase of an entire loop of the class-D amplifier and adjusting a gain of the loop. The PWM circuit 58 outputs a PWM signal of predetermined period having a duty cycle responsive to the input difference data. A switching element of a switching circuit (a class-D output stage) 60 is activated or deactivated by means of the PWM signal. The signal output from the switching circuit 60 is smoothed by means of an LC low-pass filter 62, to thus come to an analogue audio signal. The audio signal is supplied to a speaker 64, whereby an audio is emitted. The AD converter 52 subjects a signal output from the LC low-pass filter 62 to AD conversion, and negatively feeds back a result of AD conversion to the subtractor 54. Distortion arising in the switching circuit 60 or the like is lessened by means of negative feedback.

The AD converter 52 is configured in the same manner as is the ΔΣ-type AD converter shown in FIG. 1. Specifically, the subtractor 18 subjects a signal output from the LC low-pass filter 62 and the feedback signal from the PWM circuit 30 to subtraction, thereby outputting a signal pertaining to a difference between the signals. The PWM frame period of the PWM circuit 30 is set so as to become shorter than the PWM frame period of the PWM circuit 58. Since an analogue audio signal output from the LC low-pass filter 62 swings to a positive value or a negative value with reference to 0V, the PWM signal output from the PWM circuit 30 is also a signal which swings to a positive value (corresponding to “1” level) or a negative value (corresponding to a “0” level) with reference to 0V. The analogue audio signal output from the LC low-pass filter 62 varies within the range from the level “1” to the level “0” of the PWM signal. When the range of variations in the level of the signal output from the LC low-pass filter 62 exceeds the range of the level of the PWM signal output from the PWM circuit 30, the level of the signal output from the LC low-pass filter 62 is reduced by an attenuator (not shown) provided at the input of the AD converter 52, and the thus-reduced signal is input to the subtractor 18.

The integrator 20 integrates a signal output from the subtractor 18. The comparator 22 binarizes the signal output from the integrator 20 by comparison with a predetermined threshold value. The counter 24 counts a clock signal of predetermined frequency, thereby measuring respective pulse widths of a signal output from the comparator 22. Data output from the counter 24 are decimated to a sampling rate of the digital audio input data by the decimation filter 28 by way of the loop filter 26, in the AD converter 52, which compensates for the phase of the loop and adjusting a gain of the loop. Data output from the decimation filter 28 are fed back to the subtractor 54. The AD converter 52 operates in the same fashion as does the AD converter shown in FIG. 1, so long as a carrier component and aliasing noise of the PWM circuit 58 of the class-D amplifier are sufficiently cut by the LC low-pass filter 62. Since the dynamic range is enhanced by means of resolving power of the PWM circuit 30 as mentioned above, the AD converter 52 acquires a high dynamic range even when the sampling frequency of ΔΣ modulation is comparatively low, and can efficiently reduce distortion in an output from the class-D amplifier. An advantage of jitter in a digital output being reduced by means of the resolving power of the PWM signal is also yielded. The decimation filter 28 can be omitted, so long as PWM frame periods of the two PWM circuits 30 and 58 are synchronized to each other.

Figure 7:
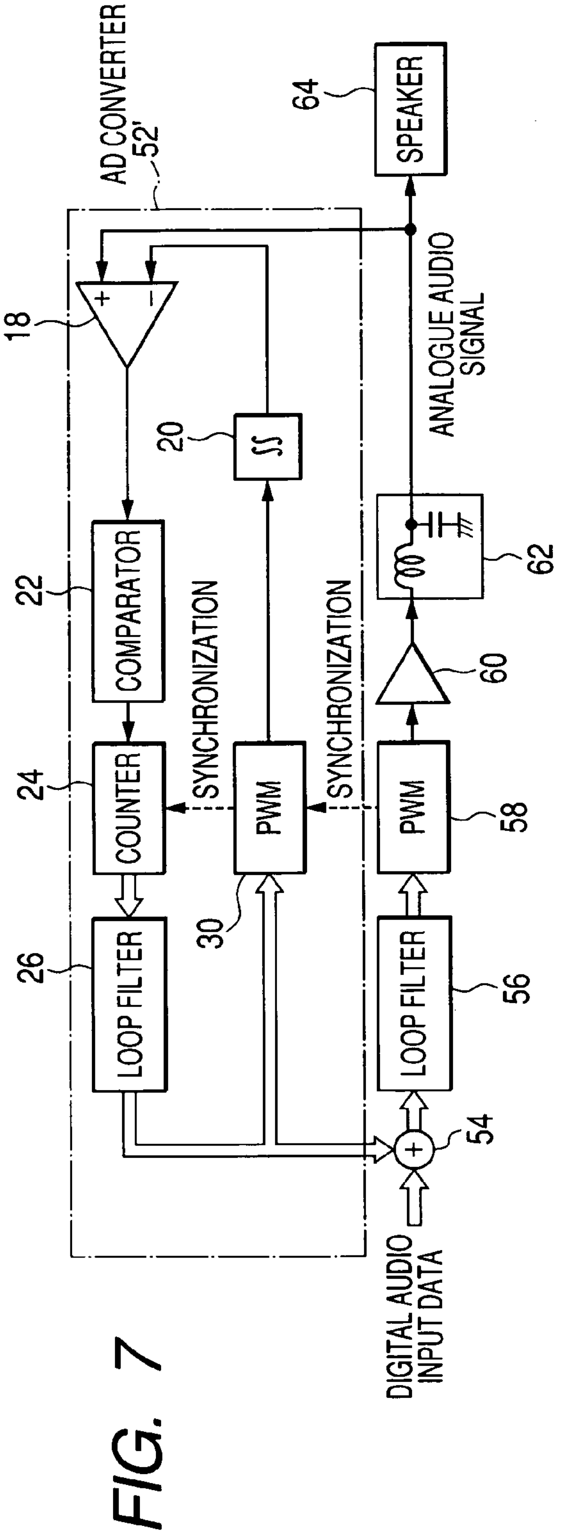
FIG. 7 is a block diagram showing a modification of the class-D amplifier shown in FIG. 6.

FIG. 7 shows a modification of the class-D amplifier shown in FIG. 6. The modification corresponds to the class-D amplifier shown in FIG. 6 where the PWM frame period of the PWM circuit 38 and the PWM frame period of the PWM circuit 50 are synchronized to each other and where the integrator 20 is positioned at the input of the subtractor 18. Elements common to those shown in FIG. 6 are assigned the same reference numerals. The PWM frame period of the PWM circuit 30 of an AD converter 52' and the PWM frame period of the PWM circuit 58 of the class-D amplifier are synchronized to each other. An integration constant of the integrator 20 and an integration constant of the LC low-pass filter 62 are set so as to become equal to each other. Since a PWM frame period of the PWM circuit 30 and a PWM frame period of the PWM circuit 58 are synchronized to each other, the decimation filter 28 shown in FIG. 6 is omitted.

Figure 8:
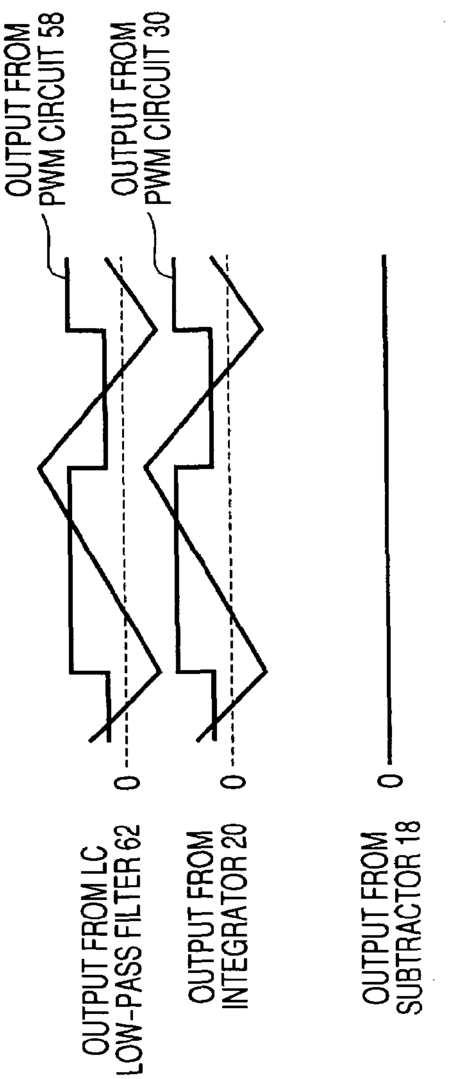
FIG. 8 is a chart showing operating waveforms of the class-D amplifier shown in FIG. 7.

It is likely that, in the circuit configuration shown in FIG. 7, an output from the LC low-pass filter 62 and an output from the integrator 20 will become totally equal to each other in a steady state as shown in FIG. 8, whereupon the output from the subtractor 18 comes to zero and no pulse signal is output from the comparator 22, to thus make it impossible for the counter 24 to perform counting and fail to activate the circuit successfully.

Figure 9:
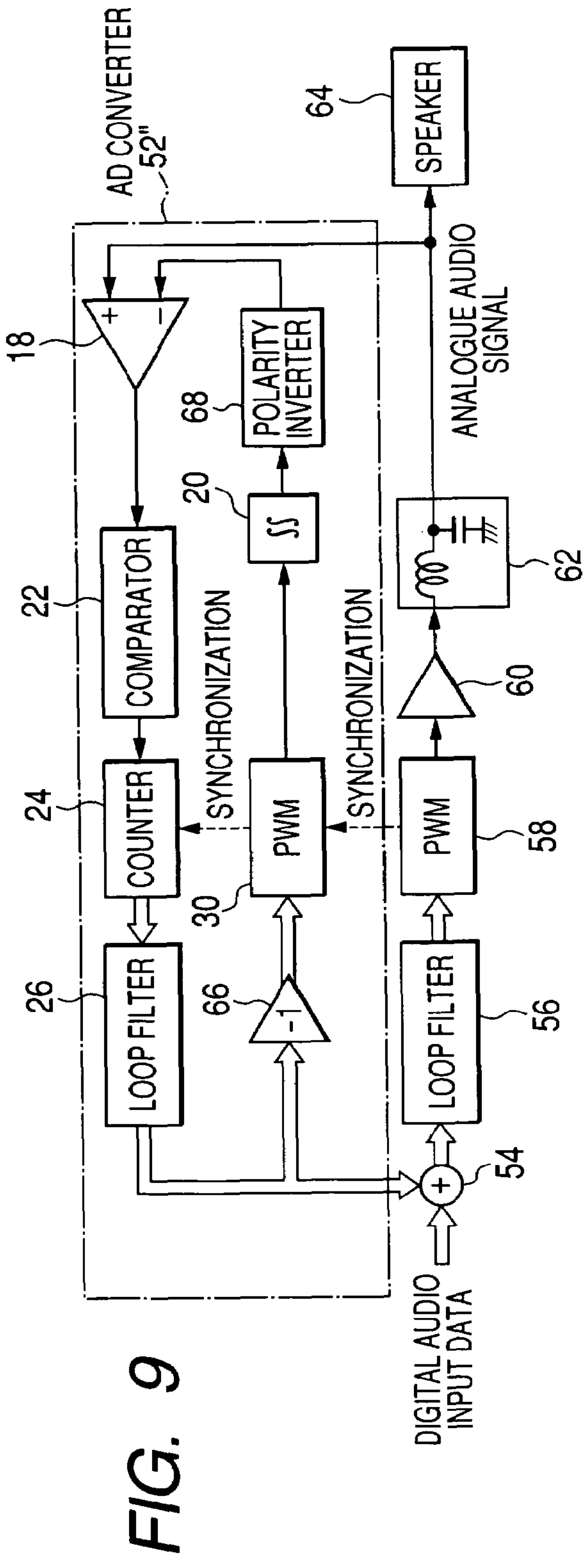
FIG. 9 is a block diagram showing an improved example of the class-D amplifier shown in FIG. 7.
Figure 10:
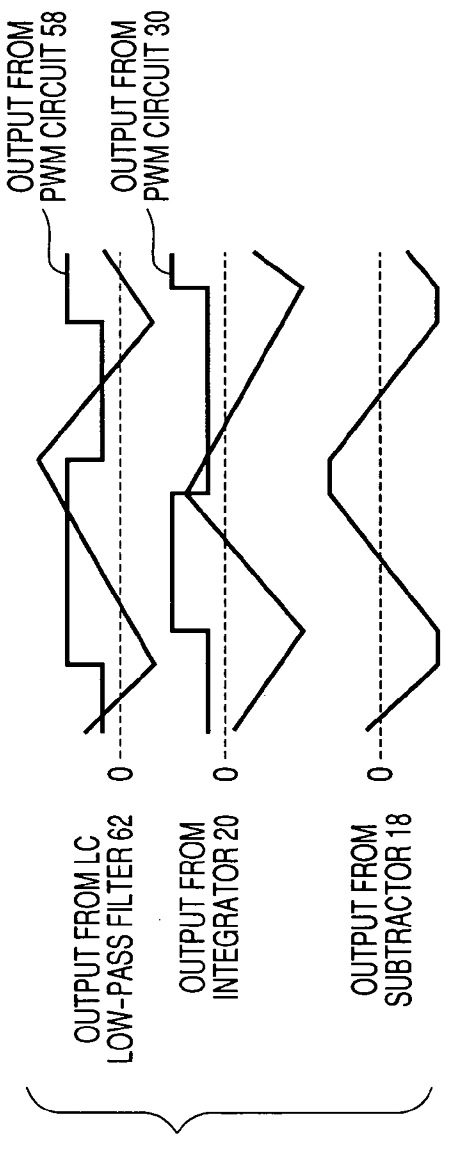
FIG. 10 is a chart showing operating waveforms of the class-D amplifier shown in FIG. 9.

FIG. 9 shows an example configuration improved in light of the problem. Elements common to those shown in FIG. 7 are assigned the same reference numerals. An AD converter 52" is configured in such a way that an output from the loop filter 26 is multiplied by a factor of −1 by means of a coefficient unit 66; that a result of multiplication is input to the PWM circuit 30; that the positive or negative polarity of an output from the integrator 20 is inverted by a polarity inversion circuit 68; and that the thus-inverted output is fed back to the subtractor 18. According to the circuit configuration, the output from the LC low-pass filter 62 and the output from the integrator 20 come to different signals at the steady state as shown in FIG. 10, and a PWM carrier component is output from the subtractor 18, whereby the counter 24 becomes able to perform counting.

Third Embodiment

Embodiment for Implementing a DC-DC Converter

Figure 11:
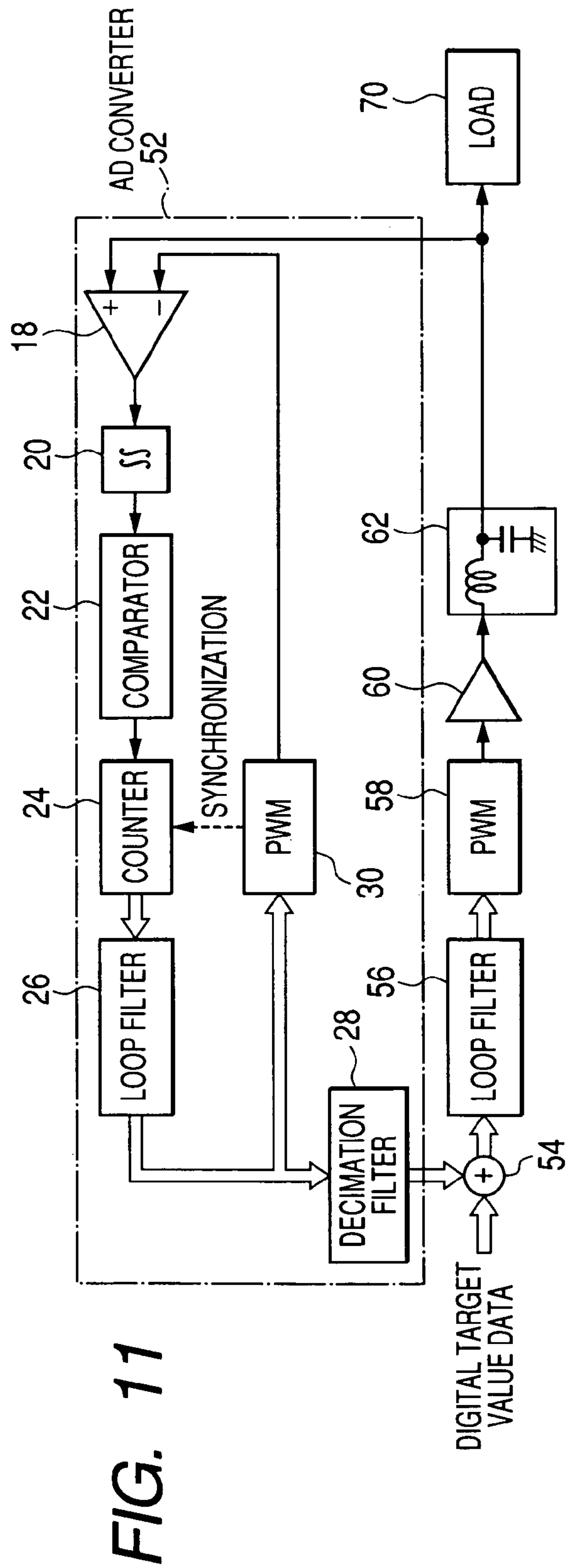
FIG. 11 is a block diagram showing a DC-DC converter according to an embodiment of the present invention.

FIG. 11 shows a DC-DC converter according to an embodiment of the present invention. The DC-DC converter has the previously-described configuration of a class-D amplifier shown in FIG. 6, wherein digital target value data (a target value of a DC output voltage) are input in place of the digital audio input data and wherein an arbitrary load 70 is connected in lieu of the speaker 64. Elements common to those shown in FIG. 6 are assigned the same reference numerals. The circuit operates in the same fashion as does the circuit shown in FIG. 6. When fluctuations arise in the voltage output from the LC low-pass filter 62 as a result of occurrence of variations in the load 70, the fluctuations are dampened by a negative feedback loop constituted by the AD converter 52. In particular, the dynamic range of the AD converter 52 is enhanced by means of resolving power of the PWM circuit 30, and hence a high dynamic range is acquired even at a comparatively-low sampling frequency of ΔΣ modulation, so that the output voltage can be controlled to a target value with high accuracy. The decimation filter 28 can be omitted, so long as the PWM frame period of the PWM circuit 30 and the PWM frame period of the PWM circuit 58 are synchronized to each other.

Likewise, in the configuration of the class-D amplifier shown in FIG. 7 or FIG. 9, digital target value data are input in lieu of the digital audio input data, and an arbitrary load is connected in place of the speaker 64, whereby a DC-DC converter can be built.

Figure 12:
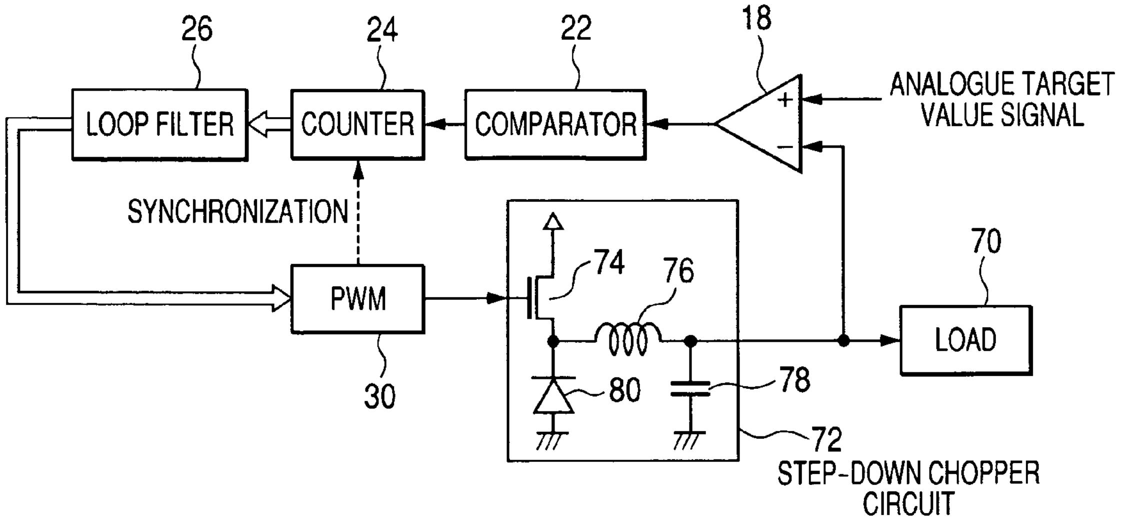
FIG. 12 is a block diagram showing the DC-DC converter according to another embodiment of the present invention.

FIG. 12 shows another embodiment of the DC-DC converter. The embodiment corresponds to a configured acquired by placing a step-down chopper circuit 72 in the feedback loop of the AD converter of the present invention. Elements common to those described in connection with the respective embodiments are assigned the same reference numerals. A target value of an output d.c. voltage is imparted by an analogue signal. A combination of an inductor 76 and a capacitor 78 in the step-down chopper circuits 72 plays the role of an integrator acting as an LC low-pass filter, and hence the integrator 20 described in connection with the embodiments is omitted. The subtractor 18 subtracts the analogue target value signal to the voltage output from the step-down chopper circuit 72, thereby outputting a signal pertaining to a difference between the signals. The comparator 22 binarizes the signal output from the subtractor 18 by comparison with a predetermined threshold value. The counter 24 counts a clock signal of predetermined frequency, thereby measuring respective pulse widths of a signal output from the comparator 22. Data output from the counter 24 are input to the PWM circuit 30 by way of the loop filter 26 for phase compensation and gain adjustment purposes. The PWM circuit 30 outputs a PWM signal of predetermined period having a duty cycle responsive to the value output from the loop filter 26, and the PWM signal is input to the step-down chopper circuit 72. The step-down chopper circuit 72 is built from a switching element (MOS transistor) 74, an inductor 76, a capacitor 78, and a circulating current diode 80, and a predetermined d.c. voltage is applied to the step-down chopper circuit from the d.c. power source. The switching element 74 is switched between ON and OFF positions by means of the PWM signal. As a result, a d.c. voltage obtained as a result of the d.c. source voltage being stepped down to a predetermined value is acquired from the capacitor 78. The output d.c. voltage is supplied to the load 70. Further, the output d.c. voltage is fed back to the subtractor 18.

According to the DC-DC converter shown in FIG. 12, when fluctuations arise in the output from the step-down chopper circuit 72 as a result of occurrence of variations in the load 70, the fluctuations are dampened by means of the negative feedback loop formed from the AD converter. In particular, the dynamic range of the AD converter is enhanced by means of resolving power of the PWM circuit 30. Hence, a high dynamic range is obtained even when the sampling frequency of ΔΣ modulation is comparatively low, so that the output voltage can be controlled with high accuracy.

Figure 13:
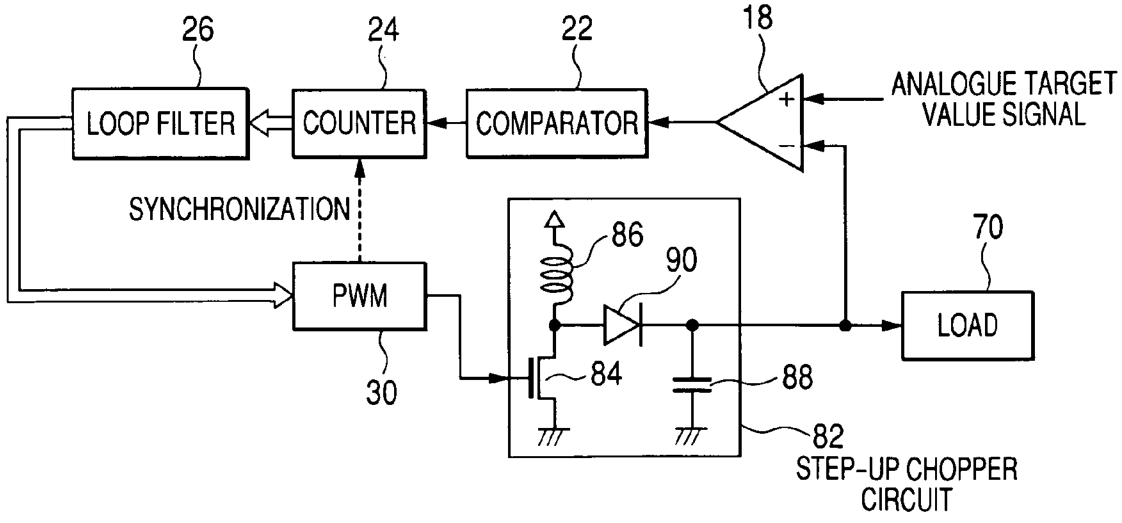
FIG. 13 is a block diagram showing the DC-DC converter according to still another embodiment of the present invention.

FIG. 13 shows still another embodiment of the DC-DC converter. The embodiment corresponds to the configuration where a step-up chopper circuit 82 is provided in place of the step-down chopper circuit 72 shown in FIG. 12. Elements common to those shown in FIG. 12 are assigned the same reference numerals. The step-up chopper circuit 82 is built from a switching element (MOS transistor) 84, an inductor 86, a capacitor 88, and a circulating current diode 90. A predetermined d.c. voltage is applied to the step-up chopper circuit from the d.c. power source. The switching element 84 is switched between ON and OFF positions by means of a PWM signal output from the PWM circuit 30. As a result, a d.c. voltage obtained as a result of the d.c. source voltage being stepped up to a predetermined value is acquired from the capacitor 88. The output d.c. voltage is supplied to the load 70. Further, the output d.c. voltage is fed back to the subtractor 18.

According to the DC-DC converter shown in FIG. 13, when fluctuations arise in the output voltage of the step-up chopper circuit 82 as a result of occurrence of variations in the load 70, the fluctuations are dampened by means of the negative feedback loop of the AD converter. In particular, the dynamic range of the AD converter is enhanced by means of resolving power of the PWM circuit 30. Hence, a high dynamic range is obtained even when the sampling frequency of ΔΣ modulation is comparatively low, so that the output voltage can be controlled with high accuracy.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2007-052299 filed on Mar. 2, 2007, the contents of which are incorporated herein for reference.

What is claimed is:

1. A ΔΣ-type AD converter comprising:

a subtractor which receives an analogue input signal and a feedback signal and which outputs a signal pertaining to a difference between the analogue input signal and the feedback signal;

an integrator which integrates a signal output from the subtractor;

a comparator which binarizes a signal output from the integrator by comparing with a predetermined threshold value;

a counter which measures respective pulse widths of a signal output from the comparator;

a loop filter which phase-compensates and gain-adjusts a count value output from the counter; and a PWM circuit which outputs a pulse signal of a predetermined period having a duty cycle responsive to the phase-compensated and gain-adjusted count value output from the loop filter and which feeds back the pulse signal as the feedback signal to the subtractor, wherein the counter is an up counter, and measures the respective pulse widths in each PWM frame period in synchronism with the PWM circuit, and resets the count value in the each PWM frame period, and the PWM circuit feeds back to the subtractor the pulse signal having a duty cycle which is set in accordance with a value of the measured pulse width in a next PWM frame period; and wherein a count value output from the counter is extracted as a converted digital output value.

2. A class-D amplifier comprising:

a first subtractor which receives digital audio input data and digital feedback data and which outputs data pertaining to a difference between the digital audio input data and the digital feedback data;

a first PWM circuit which outputs a pulse signal having a duty cycle responsive to data output from the first subtractor;

a switching circuit which is switched on the basis of a signal output from the first PWM circuit;

a low-pass filter which smoothes a signal output from the switching circuit and which supplies the smoothed signal to a speaker; and an AD converter which subjects a signal output from the low-pass filter to AD conversion and which feeds back the converted digital signal to the first subtractor as the digital feedback data, wherein the AD converter includes:

a second subtractor which receives the signal output from the low-pass filter and a feedback signal and which outputs a signal pertaining to a difference between the signal output from the low-pass filter and the feedback signal;

an integrator which integrates the signal output from the second subtractor;

a comparator which binarizes a signal output from the integrator by comparing with a predetermined threshold value;

a counter which measures respective pulse widths of a signal output from the comparator; and a second PWM circuit which outputs a pulse signal of a predetermined period having a duty cycle responsive to a count value output from the counter, and which feeds back the pulse signal as the feedback signal to the second subtractor; and wherein a count value output from the counter is fed back as the digital feedback data to the first subtractor by way of or by bypassing a decimation filter.

3. The class-D amplifier according to claim 2, wherein a PWM frame of the first PWM circuit and a PWM frame of the second PWM circuit are synchronized to each other.

4. A class-D amplifier comprising:

a first subtractor which receives digital audio input data and digital feedback data and which outputs data pertaining to a difference between the digital audio input data and the digital feedback data;

a first PWM circuit which outputs a pulse signal having a duty cycle responsive to data output from the first subtractor;

a switching circuit which is switched on the basis of a signal output from the first PWM circuit;

a low-pass filter which smoothes a signal output from the switching circuit and which supplies the smoothed signal to a speaker; and an AD converter which subjects a signal output from the low-pass filter to AD conversion and which feeds back the converted digital signal to the first subtractor as the digital feedback data, wherein the AD converter includes:

a second subtractor which receives the signal output from the low-pass filter and a feedback signal and which outputs a signal pertaining to a difference between the signal output from the low-pass filter and the feedback signal;

a comparator which binarizes the signal output from the second subtractor by comparing with a predetermined threshold value;

a counter which measures respective pulse widths of a signal output from the comparator;

a second PWM circuit which outputs a pulse signal of a predetermined period having a duty cycle responsive to a count value output from the counter;

an integrator which integrates the pulse signal output from the second PWM circuit and which feeds back an integrated signal as the feedback signal to the second subtractor; and wherein a count value output from the counter is fed back as the digital feedback data to the first subtractor by bypassing a decimation filter; and wherein the pulse signal output from the first PWM circuit and the pulse signal output from the second PWM circuit are synchronized to each other, and an integration constant of the low-pass filter and an integration constant of the integrator are set so as to become equal to each other.

5. The class-D amplifier according to claim 4, wherein the second PWM circuit outputs a pulse signal of a predetermined period having a duty cycle responsive to a value resultant from multiplication of the count value of the counter by a factor of −1; and wherein the integrator integrates the pulse signal output from the second PWM circuit and feeds back, as the feedback signal, to the second subtractor a signal resultant from inversion of a polarity of the integrated signal.

6. A DC-DC converter comprising:

a first subtractor which receives digital target value data and digital feedback data and which outputs data pertaining to a difference between the digital target value data and the digital feedback data;

a first PWM circuit which outputs a pulse signal having a duty cycle responsive to data output from the first subtractor;

a switching circuit which is switched on the basis of the pulse signal output from the first PWM circuit;

a low-pass filter which smoothes a signal output from the switching circuit and which supplies the smoothed signal to a load; and an AD converter which subjects a signal output from the low-pass filter to AD conversion and which feeds back the converted digital signal to the first subtractor as the digital feedback data, wherein the AD converter includes:

a second subtractor which receives the signal output from the low-pass filter and a feedback signal and which outputs a signal pertaining to a difference between the signal output from the low-pass filter and the feedback signal;

an integrator which integrates the signal output from the second subtractor;

a comparator which binarizes a signal output from the integrator by comparing with a predetermined threshold value;

a counter which measures respective pulse widths of a signal output from the comparator; and a second PWM circuit which outputs a pulse signal of a predetermined period having a duty cycle responsive to a count value output from the counter and which feeds back the pulse signal as the feedback signal to the second subtractor; and wherein a count value output from the counter is fed back as the digital feedback data to the first subtractor by way of or by bypassing a decimation filter.

7. The DC-DC converter according to claim 6, wherein a PWM frame of the first PWM circuit and a PWM frame of the second PWM circuit are synchronized to each other.

8. A DC-DC converter comprising:

a first subtractor which receives digital target value data and digital feedback data and which outputs data pertaining to a difference between the digital target value data and the digital feedback data;

a first PWM circuit which outputs a pulse signal having a duty cycle responsive to the data output from the first subtractor;

a switching circuit which is switched on the basis of the pulse signal output from the first PWM circuit;

a low-pass filter which smoothes a signal output from the switching circuit and which supplies the smoothed signal to a load; and an AD converter which subjects a signal output from the low-pass filter to AD conversion and which feeds back the converted digital signal to the first subtractor as the digital feedback data, wherein the AD converter includes:

a second subtractor which receives the signal output from the low-pass filter and a feedback signal and which outputs a signal pertaining to a difference between the signal output from the low-pass filter and the feedback signal;

a comparator which binarizes a signal output from the second subtractor by comparing with a predetermined threshold value;

a counter which measures respective pulse widths of a signal output from the comparator;

a second PWM circuit which outputs a pulse signal of a predetermined period having a duty cycle responsive to a count value output from the counter; and an integrator which integrates the pulse signal output from the second PWM circuit and which feeds back an integrated signal as the feedback signal to the second subtractor;

wherein a count value output from the counter is fed back as the digital feedback data to the first subtractor by bypassing a decimation filter; and wherein the pulse signal output from the first PWM circuit and the pulse signal output from the second PWM circuit are synchronized to each other, and an integration constant of the low-pass filter and an integration constant of the integrator are set so as to become equal to each other.

9. The DC-DC converter according to claim 8, wherein the second PWM circuit outputs the pulse signal of a predetermined period having a duty cycle responsive to a value resultant from multiplication of the count value of the counter by a factor of −1; and wherein the integrator integrates the pulse signal output from the second PWM circuit and feeds back, as the feedback signal, to the second subtractor a signal resultant from inversion of a polarity of the integrated signal.

10. A DC-DC converter comprising:

a subtractor which receives an analogue target value signal and a feedback signal and which outputs a signal pertaining to a difference between the analogue target value signal and the feedback signal;

a comparator which binarizes a signal output from the subtractor by comparing with a predetermined threshold value;

a counter which measures respective pulse widths of a signal output from the comparator;

a PWM circuit which outputs a pulse signal of a predetermined period having a duty cycle responsive to a count value output from the counter; and a step-down chopper circuit or a step-up chopper circuit formed by combination of a switching element switched on the basis of a signal output from the PWM circuit, an inductor, a capacitor, and a diode, wherein a voltage output from the step-down chopper circuit or the step-up chopper circuit is fed back as the feedback signal to the subtractor, and a voltage output from the step-down chopper circuit or the step-up chopper circuit is supplied to a load.

* * * * *